(12) United States Patent
Nakhjiri et al.

(10) Patent No.: US 11,949,075 B2
(45) Date of Patent: Apr. 2, 2024

(54) POWER TIER MANAGEMENT SYSTEM FOR LIGHT ELECTRIC VEHICLES

(71) Applicant: NEUTRON HOLDINGS, INC., San Francisco, CA (US)

(72) Inventors: Madjid Nakhjiri, Los Gatos, CA (US); Dave Butler, San Francisco, CA (US)

(73) Assignee: Neutron Holdings, Inc., San Francisco, CA (US)

( * ) Notice: Subject to any disclaimer, the term of this patent is extended or adjusted under 35 U.S.C. 154(b) by 38 days.

(21) Appl. No.: 17/245,764

(22) Filed: Apr. 30, 2021

(65) Prior Publication Data

US 2021/0344051 A1 Nov. 4, 2021

Related U.S. Application Data

(60) Provisional application No. 63/018,998, filed on May 1, 2020.

(51) Int. Cl.
| | | |
|---|---|---|
| *H01M 10/42* | (2006.01) |
| *B60L 53/80* | (2019.01) |
| *B60L 58/12* | (2019.01) |
| *B60S 5/06* | (2019.01) |
| *B62J 43/16* | (2020.01) |
| *B62M 6/90* | (2010.01) |
| *G01R 31/382* | (2019.01) |
| *G01R 31/396* | (2019.01) |
| *H02J 7/00* | (2006.01) |

(52) U.S. Cl.
CPC ......... *H01M 10/425* (2013.01); *B60L 53/80* (2019.02); *B60L 58/12* (2019.02); *B60S 5/06* (2013.01); *B62J 43/16* (2020.02); *B62M 6/90* (2013.01); *G01R 31/382* (2019.01); *G01R 31/396* (2019.01); *H02J 7/0031* (2013.01); *B60L 2200/24* (2013.01); *B62K 2202/00* (2013.01); *H01M 2010/4271* (2013.01); *H01M 2010/4278* (2013.01); *H01M 2220/20* (2013.01)

(58) Field of Classification Search
CPC ....... H01M 10/425; H01M 2010/4271; H01M 2010/4278; H01M 2220/20; G01R 31/396; G01R 31/382; B60L 58/12; B60L 53/80; B60L 2200/24; H02J 7/0031
USPC ........................................................ 320/136
See application file for complete search history.

(56) References Cited

U.S. PATENT DOCUMENTS

| | | |
|---|---|---|
| 8,989,954 B1 | 3/2015 | Addepalli et al. |
| 2008/0071436 A1 | 3/2008 | Dube et al. |
| 2011/0291616 A1* | 12/2011 | Kim .......................... H02J 5/00 320/109 |

(Continued)

*Primary Examiner* — Nathaniel R Pelton
(74) *Attorney, Agent, or Firm* — Dentons US LLP

(57) ABSTRACT

The present application describes power tier management for a battery of a light electric vehicle. In examples, a power tier of a battery may have an associated threshold power and time to exert a battery energy over the time of the power tier. Power tiers may be adjusted to lengthen or shorten an overall battery life and remaining battery life of the battery of the light electric vehicle. In an aspect, a processor may control or limit power to specific components and/or functions of the light electric vehicle to stay within or enter a determined power tier. Information may be received and processed by the processor to determine and apply one or more power tiers.

14 Claims, 7 Drawing Sheets

(56) References Cited

U.S. PATENT DOCUMENTS

| | | | |
|---|---|---|---|
| 2014/0111121 A1* | 4/2014 | Wu ........................ | B60L 15/20 |
| | | | 318/139 |
| 2015/0032301 A1* | 1/2015 | Lamba .................... | B60L 58/20 |
| | | | 701/19 |
| 2015/0298564 A1* | 10/2015 | Johansson ............. | B60L 53/665 |
| | | | 320/109 |

* cited by examiner

POWER TIER MANAGEMENT SYSTEM FOR LIGHT ELECTRIC VEHICLES

CROSS-REFERENCE TO RELATED APPLICATION

This application claims priority to and the benefit of U.S. Provisional Application No. 63/018,998 filed on May 1, 2020, the disclosure of which is hereby incorporated by reference herein in its entirety.

BACKGROUND

Electric vehicles (e.g., scooters, bicycles, mopeds, etc.) are typically powered by a power source such as a battery, which may be rechargeable. As the electric vehicle is used, power in the battery is consumed from a limited battery energy. The rate of consumption of the battery energy impacts the battery life. Different functions and/or components of the light electric vehicle may consume power from the battery at different rates. Thus, overall battery life may depend on how the light electric vehicle is used.

SUMMARY

Light electric vehicles (e.g., scooters, bicycles, mopeds, etc.) are typically powered by a power source such as a rechargeable battery. In some cases, the rechargeable battery may be removably coupled to a light electric vehicle. As such, a rechargeable battery may be exchanged for another rechargeable battery (e.g., a rechargeable battery that has more power or is fully charged). While a rechargeable battery is coupled to a light electric vehicle (e.g., providing power to the light electric vehicle and/or components of the light electric vehicle), the amount of power drawn from the battery may be managed. For example, the light electric vehicle may have a power tier management system for the battery to adjust the battery life.

In an example, a method for determining a power tier of a rechargeable battery coupled to a light electric vehicle is provided. The method includes receiving information associated with one or more of the following: a geolocation, a communication availability, and a customer identification. The method further includes processing the information. Based on the processed information, the method may use machine learning to select a power tier from a plurality of power tiers. The method may further include applying the selected power tier to the rechargeable battery.

In another example, the information further includes a remaining life of the rechargeable battery. In a further example, the plurality of power tiers includes: a first power tier enabling the rechargeable battery to power a drive train of the light electric vehicle and a communications link of the light electric vehicle; and a second power tier enabling the rechargeable battery to power the communications link of the light electric vehicle, and preventing the rechargeable battery from powering the drive train. In yet another example, processing the information includes comparing the information to an associated threshold.

In another example, the information associated with the geolocation includes a distance from one or more of: a geofence boundary; a specified location; and a communication tower. In yet another example, the communication availability comprises one or more of: an elapsed time from connection with a communication channel; a communication type of the communication channel; and a signal strength of the communication channel. In a further example, the method further includes: identifying that the communication channel is currently available; and transmitting an identification communication comprising location information about the light electric vehicle. In still a further example, the customer identification comprises one or more of: a type of a payment transaction; a specified customer; and an amount of the payment transaction. In another example, the light electric vehicle is an electric bicycle or an electric scooter.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
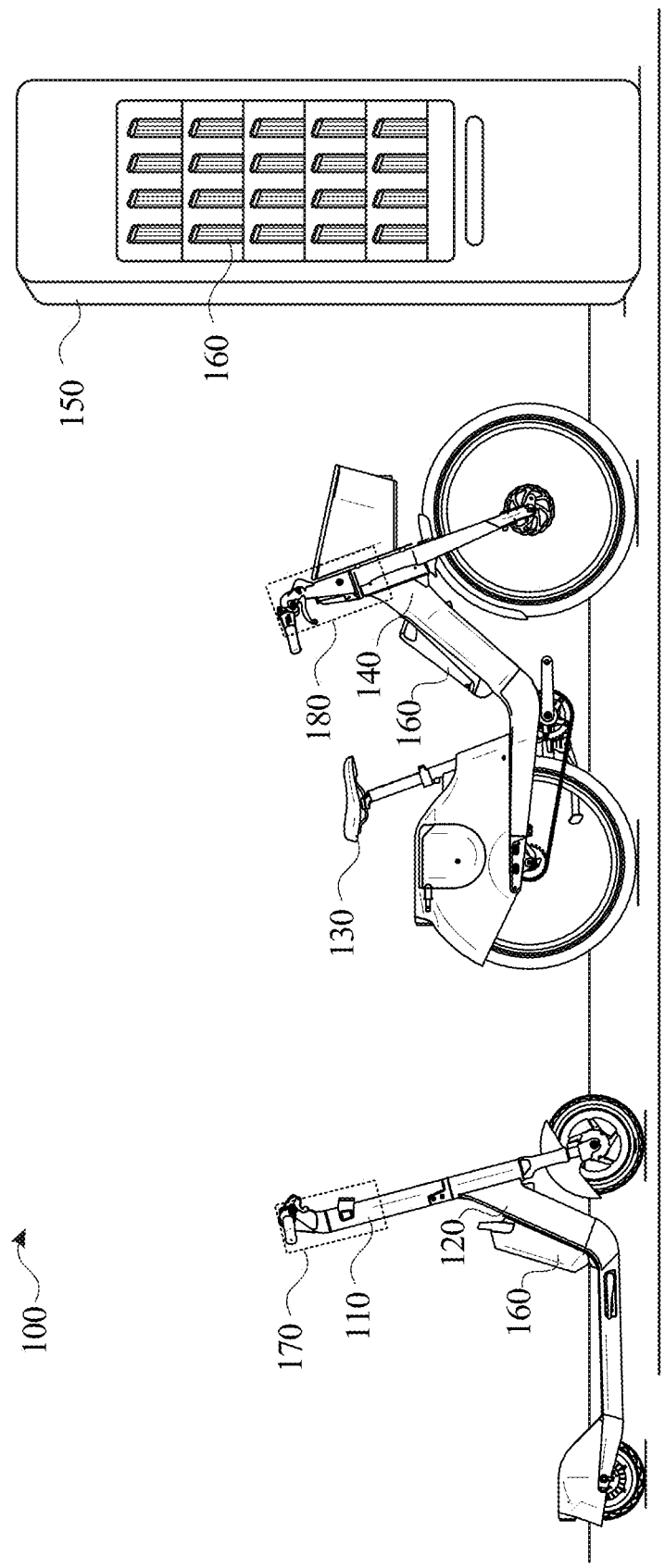
FIG. 1A illustrates an example environment in which a rechargeable battery kiosk receives and distributes rechargeable batteries for different kinds of light electric vehicles according to one or more examples.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

Light electric vehicles (e.g., scooters, bicycles, etc.) are typically powered by a power source such as, for example, a rechargeable battery. In some cases, the rechargeable battery may be removably coupled to a light electric vehicle. As such, a rechargeable battery may be exchanged for another rechargeable battery (e.g., a rechargeable battery that has more power or is fully charged). While a rechargeable battery is coupled to a light electric vehicle (e.g., providing power to the light electric vehicle and/or components of the light electric vehicle), the amount of power drawn from the battery may be managed. For example, the light electric vehicle may have a power tier management system for the battery. A power tier corresponds to, for example, enabling or disabling features and power availability to certain components to increase performance or save battery power based on the vehicle's operating state and predicted power needs.

The present disclosure describes a power tier management system for light electric vehicles (e.g., scooters, bicycles, mopeds, etc.). The power tier management system may determine a power tier of a rechargeable battery that powers various functionalities of the light electric vehicles. The rechargeable battery may have a limited battery life. Each power tier may enable different functionalities of the light electric vehicle, which may impact battery life. Thus, managing power tiers of a rechargeable battery may increase or decrease overall battery life.

In an example, a light electric vehicle may be available from a provider to be reserved and used by a rider. In this example, limited battery life may result in the light electric vehicle becoming lost, abandoned, stolen, or in a location that is otherwise unknown to the provider. This may occur when a rider of the light electric vehicle leaves the light electric vehicle in a location that is not easily discoverable by the provider, and/or if the rider does not otherwise relay a location of the light electric vehicle to the provider. To reduce the risk of loss, providers may manage power tiers of a rechargeable battery to increase battery life. Increased battery life may allow the light electric vehicle a longer period of time to communicate its location information and facilitate recovery.

Although aspects of the disclosure describe the light electric vehicle being powered by a rechargeable battery, it should be appreciated that other energy sources, in any combination, may also be used to power the light electric vehicle (e.g., hydrocarbon fuel, electric power, hybrid technologies, etc.). Additionally, it should be appreciated that characteristics of the light electric vehicle may vary, including, but not limited to, the hardware of the light electric vehicle (e.g., number of engines/electric motors, seating or cargo capacity, drive train configuration, etc.), and vehicle payload.

FIG. 1A illustrates an example environment 100 in which aspects of the present disclosure may be practiced. As illustrated, environment 100 includes at least one electric scooter 110, at least one electric bicycle 130, and a rechargeable battery kiosk(s) 150. It will be appreciated that the electric scooter 110 and the electric bicycle 130 are provided as example light electric vehicles and that, in other examples, aspects described herein apply to other types of light electric vehicles.

As described herein, the environment 100 includes a network service that receives information from the electric scooter 110 and/or the electric bicycle 130 (also referred to herein as light electric vehicles) over a network communication channel (e.g., one or more networks, the Internet, etc.). The information enables a user, using a client application executing on a computing device, to locate, request, and/or reserve (e.g., rent or borrow for a duration of time) one or more light electric vehicles. The information may also enable a user to locate, request, and/or reserve a rechargeable battery for the light electric vehicles. In some examples, the rechargeable battery may be used across different light electric vehicles. For example, the same rechargeable battery may be used by the electric scooter 110 and the electric bicycle 130.

In some examples, the rechargeable battery may be used by different light electric vehicles made by different companies. For example, the rechargeable battery may be made by a first company, the electric scooter 110 may be made by a second company, and the electric bicycle 130 may be made by a third company. The rechargeable battery may be interchangeable between each of the light electric vehicles.

In some examples, the network service includes one or more computing systems or servers that are remote from the computing device of the user and the light electric vehicles. The one or more computing systems include an application programming interface (API) that enables the one or more computing systems to receive information from, send information to, and otherwise interact with the computing device, the light electric vehicles 110, 130 and/or the rechargeable battery kiosk(s) 150.

For example, the client application executing on the computing device of the user receives, from the network service over the network communication channel, information about a location of one or more of the light electric vehicles. The location of each of the light electric vehicles can then be provided on a user interface of the client application. Additionally or alternatively, the location information about a location of one or more of the light electric vehicles may be communicated between a plurality of light electric vehicles and/or a plurality of client applications executing on one or more computing devices.

In one example, the user interface of the client application includes a map that displays a determined location of the user and/or a determined location of the light electric vehicles. In some examples, the determined location of the user and/or the determined location of the light electric vehicles is based, at least in part, on Global Positioning System (GPS) data (or other location information) received by the network service over the network communication channel.

The user interface of the client application may display the location information of the user and the light electric vehicles as different icons (or other such representations). Once the location information is displayed, the user may select an icon representing a type of light electric vehicle (e.g., an icon for an electric scooter 110 or an icon for an electric bicycle 130). The user interface of the client application then generates or determines a route (e.g., provides directions) from the user's current location to the selected light electric vehicle. Selection of one of the icons may also enable the user to reserve (e.g., place a hold on) the light electric vehicle (to ensure that the light electric vehicle will be at the determined location when the user arrives), rent the light electric vehicle and/or borrow the light electric vehicle for a period of time.

Each light electric vehicle and/or the network service also includes a location tracking system that tracks, receives, and/or determines a location of each light electric vehicle as it is used. In some examples, the location tracking system tracks the location information of the light electric vehicle in real-time or substantially real-time. In other examples, the location tracking system determines the location information of the light electric vehicle at periodic intervals (e.g., every minute, every five minutes, every ten minutes, etc.). In yet other examples, the location tracking system may track the location of the light electric vehicle in real-time or substantially real-time when the light electric vehicle is rented or otherwise used by a user and may track location information at periodic intervals when the light electric vehicle has been reserved or is otherwise not is use. The location information may be communicated directly between the light electric vehicle and the network service and/or may be communicated among any variety of peer-to-peer interactions. For example, the location information of a first electric vehicle may be sent to a second electric vehicle, which may send the location information for the first electric vehicle and/or location information for the second electric vehicle to the network service. Additionally or alternatively, location information may be sent to the network service via client application running on a computing device. For example, the light electric vehicle may send location information to the client device and the client device may then send the location information to the network service.

The one or more computing systems of the network service may also include one or more databases that store information about each of the light electric vehicles, the rechargeable batteries, and/or the rechargeable battery kiosk(s) 150. For example, the one or more databases may store location information for each light electric vehicle and/or the rechargeable battery kiosk(s) 150, rechargeable battery status information for rechargeable batteries used by each light electric vehicle and/or in the rechargeable battery kiosk(s) 150, rechargeable battery kiosk information (e.g., the number of rechargeable batteries housed by the rechargeable battery kiosk 150), and/or light electric vehicle status information (e.g., how many times the light electric vehicle has been used, whether the light electric vehicle is damaged, whether the light electric vehicle should be serviced etc.).

The one or more databases may also store information about the user. This information may include a profile of the user (e.g., username, contact information, etc.) security credentials of the user (e.g., a password), historical usage data, payment information and the like.

The one or more computing systems of the network service may also include a matching system. The matching system receives, manages or otherwise handles various requests from the user. The requests may include light electric vehicle rental requests and light electric vehicle reservation requests. For example, when a vehicle rental request is received from the client application executing on the user's computing device, the matching system may communicate with the location tracking system and determine which light electric vehicle should be matched with or otherwise assigned to the requesting user. Additionally or alternatively, the matching system may be used by the vehicle provider to collect or locate one or more light electric vehicles.

The one or more computing systems of the network service may also include a payment system that processes payment information of the rider. For example, when a rider rents and uses a light electric vehicle, the rider may be charged for the usage based on a duration of use and/or a travel distance. Once the rider has finished using the light electric vehicle (e.g., by arriving at their intended destination, a check-in point, a battery kiosk 150, etc.), the payment system may automatically process the payment information of the rider.

As discussed above, the environment 100 includes one or more light electric vehicles including, but not limited to, an electric scooter 110 and an electric bicycle 130. In examples, the electric scooter 110 includes vehicle components (e.g., wheels, axles, baseboard, handlebar, braking mechanisms, etc.), one or more electric motors, control systems, sensors, speakers, and/or lights, which may be powered by a rechargeable battery. The rechargeable battery may be secured to the electric scooter 110 by a battery holster 120.

Likewise, and in some examples, the electric bicycle 130 includes vehicle components (e.g., wheels, axles, chains, gears, bicycle seat, handlebar, bicycle frame, braking mechanisms, etc.), one or more electric motors, control systems, sensors, speakers, and/or lights, which may also be powered by a rechargeable battery. The rechargeable battery may be secured to the electric bicycle 130 by a battery holster 140.

The control system or head unit 170 of the electric scooter 110 and/or the head unit 180 of the electric bicycle 130 manages the power output to the one or motors, provides a visual indication as to a charge level of the rechargeable battery in the battery holster 120, and/or communicates directly (e.g., via Wi-Fi, Bluetooth, etc.) or indirectly (e.g., via one or more remote computing devices, one or more networks, the Internet, etc.) with the computing device of the rider and/or with the network service. Thus, the head unit 170 of the electric scooter 110 and/or the head unit 180 of the electric bicycle 130 may be electrically coupled, mechanically coupled, and/or communicatively coupled to one or more components of the light electric vehicle and/or to the battery. In an example, the head unit may be positioned in or along a frame of the light electric vehicle. For example, the head unit 170 of the electric scooter 110 may be coupled to the frame near or adjacent to the handlebars.

Example communications include, but are not limited to, initiating locking or unlocking of the electric scooter 110 or the electric bicycle 130 (e.g., initiating or ending a travel session), initiating a battery swap to exchange a rechargeable battery in the battery holster 120 or the battery holster 140 with a rechargeable battery in a rechargeable battery kiosk 150, determining a location and/or status information of the electric scooter 110 or the electric bicycle 130, determining a location of a rechargeable battery and/or a rechargeable battery kiosk 150, determining a battery level of the battery, determining a power tier of the battery, and determining available communication channels and/or types of communication. Lights, speakers, and/or other output devices of the electric scooter 110 or the electric bicycle 130 may be used to provide an indication as to the location of the electric scooter 110 or the electric bicycle 130 or as an anti-theft mechanism, among other examples.

As shown in FIG. 1A, each light electric vehicle may include a battery holster. For example, the battery holster 140 is affixed to the seat tube of the electric bicycle 130, while the battery holster 120 is illustrated as being affixed to the handlebar column of the electric scooter 110. It will be appreciated that the locations of the battery holsters 120 and 140 are provided as examples, and that a battery holster may be positioned in a variety of alternate locations in other examples. For example, the battery holster 140 may be affixed to the handlebar column or the cross bar of the electric bicycle 130. As another example, the battery holster 120 may be affixed to the deck or located near the rear of the electric scooter 110.

The battery holster 120 is operable to receive a rechargeable battery and electrically couple the battery with the head unit 170, 180 such that the power drawn from the battery and/or power channels from the battery to other components on the light electric vehicle may be controlled by the head unit 170. Similarly, battery holster 140 is operable to receive a rechargeable battery and electrically couple the battery with the head unit 180. As used herein, a head unit (e.g., head unit 170 and head unit 180) is a unit coupled to the light electric vehicle that is capable of controlling functionalities of the light electric vehicle. The head unit may include a communication link that is capable of various communication types, such as 3G, 4G, 5G, LTE, Bluetooth, GPS, etc.

In another example, the head unit (e.g., head unit 170 and/or head unit 180) may control how much power is drawn from the battery and/or control which set of components may receive power from the battery. For example, the head unit may include a processor that manages battery usage. Various functionalities associated with the light electric vehicle may use different amounts of power, and thus by limiting or managing which functionalities and/or components receive power, the battery life of the battery may be lengthened or shortened. For example, the drive train used to move the light electric vehicle may use more power than the communications link. Additionally, different communication types of the communications link may use different amounts of power. For example, communication via 3G, 4G, 5G, LTE, etc. may use more power than communication via Bluetooth. The power usage may also vary depending on the form and amount of information to be communicated via the communications link. For example, sending larger data packets via the communications link may require more power than sending smaller data packets. Other features of the light electric vehicle may also impact battery life, including the type of vehicle, vehicle payload, etc.

In an example, the processor of the head unit (e.g., head unit 170 and/or head unit 180) may manage power tiers of the rechargeable battery. Power tiers may limit, restrict, or enable a functionality of the light electric vehicle at any given point in time. For example, a power tier may restrict the functionalities of the light electric vehicle to one or more of the following: drive train and fully enabled communications link (e.g., all communication types); drive train and partially enabled communications link (e.g., limited communication types and/or limited communication channels); drive train only; fully enabled communications link only; lights on or off; and partially enabled communications link only. As an example, a first power tier may allow functionalities of the drive train and the fully enabled communications link. A second power tier may allow functionalities of only the fully enabled communications link. A third power tier may allow functionalities of only the partially enabled communications link.

The processor may effect the power tiers using software configured to turn off subsystems of the system based on the desired power tier. The subsystems can be, for example, the drive train, the fully enabled communications link, and the partially enabled communications link. The system is designed with a plurality of switches, such as transistors or MOSFETs, to open or close circuits that deliver power to various system components. For example, the processor can close switches to deliver power to systems or open switches to turn off power to certain systems. The switches may also be configured to determine different power levels available to the power train. For example, the battery may be capable of delivering a maximum voltage of 24V. The processor may decide to save power by delivering a lower voltage to the power train, e.g., 18V. This may result in less power delivered to the motor, resulting in a reduction of torque, but would prolong the battery life. This feature could be achieved by, for example, opening or closing switches connected transformers configured to deliver different power levels to the power train.

In an example, an individual rider may operate a light electric vehicle for a period of time and then determine that the rechargeable battery in use by the light electric vehicle needs to be recharged. In some instances, the light electric vehicle, or the rechargeable battery itself, may communicate current battery charge information for the rechargeable battery to the computing device of the rider. In another example, the rechargeable battery and/or battery holster 120 and 140 may include a visual indicator to display the charge level of the rechargeable battery. As an addition or an alternative, the electrical vehicle, or the rechargeable battery itself, may communicate current battery charge information for the rechargeable battery to the network service, which can provide battery information to the computing device of the rider. When this occurs, the rider may be directed to a rechargeable battery kiosk 150. For example, the network service can transmit data, over one or more networks, to the computing device to cause the computing device to display information about a particular rechargeable battery kiosk 150. In other examples, the battery life may not be long enough for the light electric vehicle to transport itself to a rechargeable battery kiosk 150 using the drive train of the light electric vehicle. In this instance, the battery life may be extended by the power tier management system. For example, the power tier management system may limit or cease functionality of the drive train and maintain communications functionality so that the light electric vehicle location may be determined at a network service.

If the rider arrives at the rechargeable battery kiosk 150, the rider may exchange the light electric vehicle's current battery with another rechargeable battery housed by the rechargeable battery kiosk 150, thereby enabling the light electric vehicle to continue or resume operation. In some instances, the rider can use the client application executing on the computing device of the rider to locate and/or select a rechargeable battery kiosk 150, receive directions to the rechargeable battery kiosk 150, and initiate a battery swap with the rechargeable battery kiosk 150 when the rider arrives at a kiosk location. In another example, the rider can initiate a battery swap at the rechargeable battery kiosk 150.

According to some examples, when a battery swap is initiated, the control system of the light electric vehicle may enable the rechargeable batteries 160 to be removed from battery holsters such as battery holsters 120 or 140. The rechargeable batteries 160 may then be exchanged for a different rechargeable battery 160 housed by the rechargeable battery kiosk 150. The rechargeable batteries 160 may subsequently be inserted into the battery holster of the light electric vehicle.

The rechargeable battery kiosk 150 stores and charges a set of rechargeable batteries 160. Each rechargeable battery 160 in the set can be used by both the electric scooter 110 and the electric bicycle 130. In some examples, multiple rechargeable battery kiosks 150 are located within a city, county, or other geographic region. For example, one rechargeable battery kiosk may be located in or otherwise associated with a first geographic area within a geographic region and another rechargeable battery kiosk may be located in or otherwise associated with a second geographic area within the geographic region.

Thus, when a rider is traveling through the geographic region on a light electric vehicle and wants or needs to exchange the light electric vehicle's current rechargeable battery for one that has more charge, the rider may be directed (e.g., via the client application executing on the rider's computing device) to the rechargeable battery kiosk 150 associated with the geographic region. When the rider arrives at the rechargeable battery kiosk 150, the rider can exchange their current rechargeable battery for one that is fully charged or substantially fully charged. This enables the rider to travel using a light electric vehicle across distances that may otherwise not be possible using the power provided by one charge of a rechargeable battery.

In some examples, the rechargeable battery kiosk 150 comprises a control system that communicates directly or indirectly with a computing device of the rider when performing a battery swap such as described above. In examples, the control system communicates with a remote computing device(s), e.g., that implements the network service, using a connection to one or more networks, such as a Wi-Fi network and/or a cellular network. The rechargeable battery kiosk 150 may receive and/or report rechargeable battery status information to a remote computing device(s). The battery status information can include, but is not limited to, battery charge levels, battery health, a number of rechargeable batteries currently available at the rechargeable battery kiosk, and/or usage demand statistics.

Figure 1B:
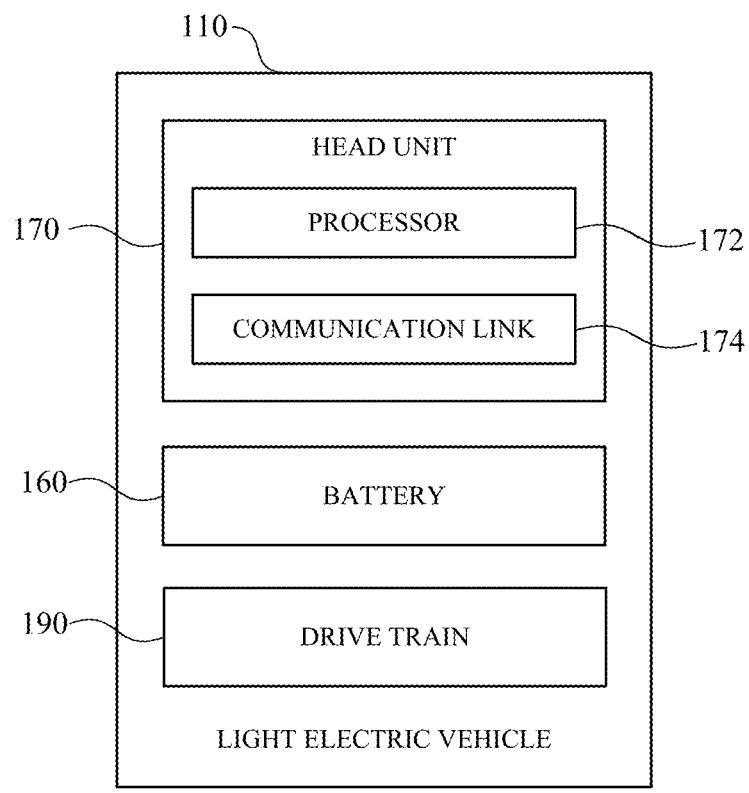
FIG. 1B illustrates a schematic of components coupled to a light electric vehicle.

FIG. 1B illustrates a schematic of components of a light electric vehicle 110. In various aspects, a light electric vehicle 110 may include a battery 160, a drive train 190, and a head unit 170. The battery 160 may be used to power both the drive train 190 and the head unit 170 of the light electric vehicle 110. The head unit 170 may include a processor 172 and a communication link 174. As described herein, the processor 172 may manage power tiers of the battery 160. For example, the processor 172 may control (e.g., limit, as processor 172 may be associated with a power tier threshold) a quantity of power that may be drawn from different components of the light electric vehicle 110. As an example, the processor 172 may limit power provided to, or received by, the drive train 190 and/or a communication link 174. The amount of power provided to the drive train 190 and the communication link 174 may be different. In some examples, no power may be provided to the drive train 190 and/or the communication link 174.

As described herein, the communication link 174 may be capable of communicating via a variety of communication channels, such as 3G, 4G, 5G, LTE, Bluetooth, Wi-Fi, etc. The processor 172 and/or the communication link 174 may select and/or restrict or limit the use of one or more communication channels. The selection and/or restriction of communication channels may be based on which channels are available. In an example, the location of the light electric vehicle 110 may cause one or more communication channels to be unavailable (e.g., below a threshold of signal strength, such as being outside of a range of a Wi-Fi network, satellite, cell tower, or other communication tower). In an aspect, the power may be limited to communication channels that are available. As another example, communication channels may be used based on detecting that a computing device is available to receive communications sent over the associated communication channel. As another example, communication channels may be limited based on an amount of power provided to the communication link 174 by the processor 172. As a further example, the communication link 174 may limit or restrict the frequency of communication and/or an amount of data received and/or sent via a communication channel based on the restrictions or limits described herein. In an example, the communication link 174 may limit or restrict the type of communication channel, the frequency of communication, and/or an amount of data communicated and/or received by the head unit 170 based on a power tier of the battery 160 determined by the processor 172.

Figure 2:
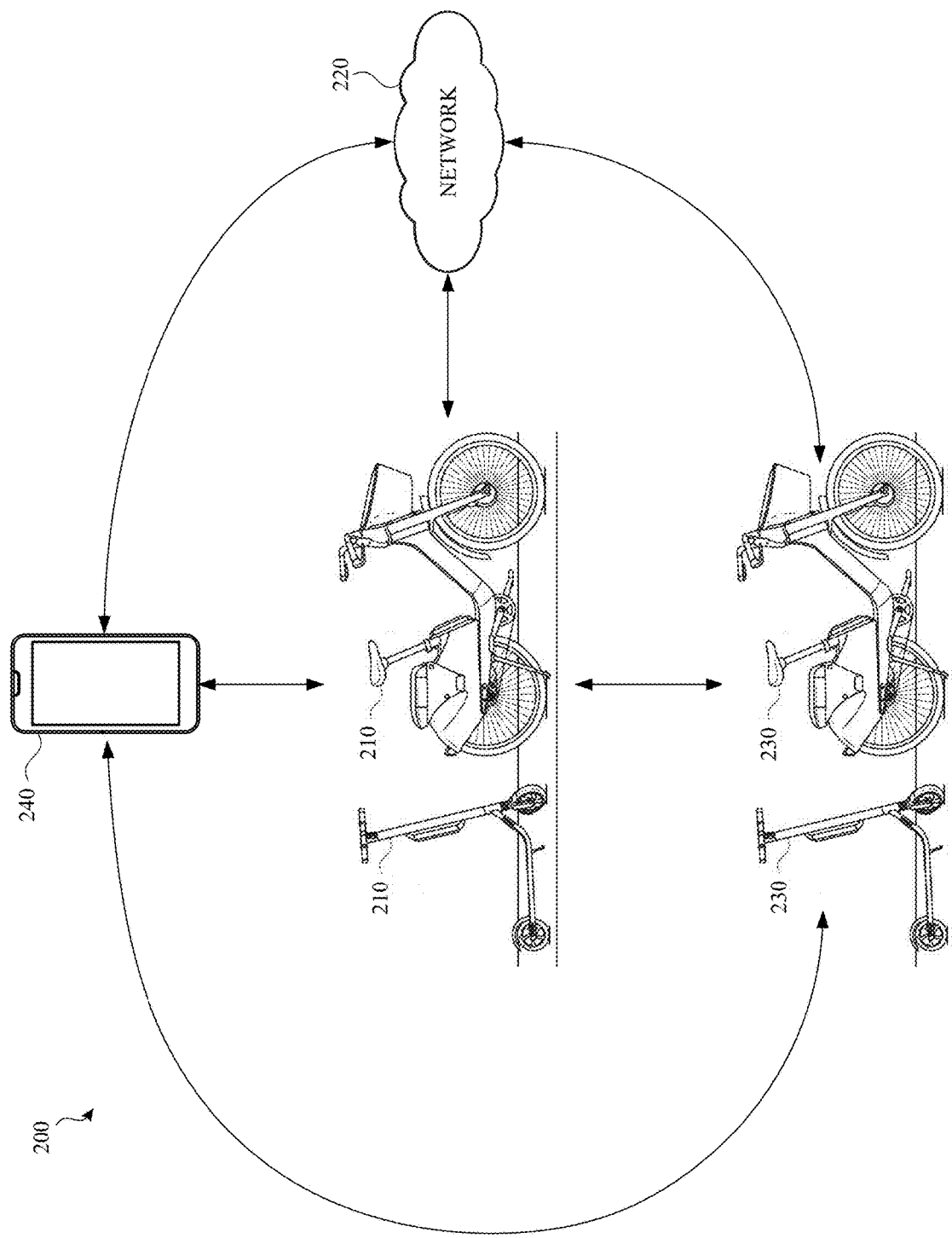
FIG. 2 illustrates a system for power tier management for a rechargeable battery coupled to a light electric vehicle.

FIG. 2 illustrates a system 200 for power tier management for a rechargeable battery coupled to a light electric vehicle 210. In addition to the light electric vehicle 210, the system 200 may include a network 220, a light electric vehicle 230 (which may be proximate to the light electric vehicle 210), and a computing device 240. The light electric vehicle 210 and the light electric vehicle 230 may have components and functions similar to those discussed for light electric vehicles 110 and 130 described in FIGS. 1A and 1B. The light electric vehicle 210 may wirelessly communicate with the network 220, the light electric vehicle 230 and/or the computing device 240 over a communication channel (as described herein) using a communication link (e.g., communication link 174). As described herein, information about the light electric vehicle 210 may be required or desired by the network 220 (otherwise referred to herein as a network service) and/or by the computing device 240 (as may be associated with a potential rider of the light electric vehicle 210).

As shown, there may be a variety of network communication paths for the light electric vehicle 210 to send information to the network 220. For example, information may be sent from the light electric vehicle 210 directly to the network 220 over a communication channel. In other aspects, the light electric vehicle 210 may indirectly communicate or send information to the network 220. For example, indirect communication may include information being sent from the light electric vehicle 210 to a computing device 240 via a communication channel, which may be relayed from the computing device 240 to the network 220 at a time when a communication channel between the computing device 240 and the network 220 is available. As another indirect communication example, the light electric vehicle 210 may send information to a proximate light electric vehicle 230. The light electric vehicle 230 may then relay the information to a computing device 240 and/or the network 220 at a time when a communication channel between the light electric vehicle 230 and either the computing device 240 and/or the network 220 is available. If the light electric vehicle 230 relays the information to a computing device 240, the information may be relayed from the computing device 240 to the network 220, at a time when a communication channel between the computing device 240 and the network 220 is available.

Additionally, there may be a variety of client communication paths for the light electric vehicle 210 to send information to the computing device 240. For example, information may be sent from the light electric vehicle 210 directly to the computing device 240 over a communication channel. In other aspects, the light electric vehicle 210 may indirectly communicate or send information to the computing device 240. For example, indirect communication may include information being sent from the light electric vehicle 210 to a network 220 via a communication channel, which may be relayed from the network 220 to the computing device 240 at a time when a communication channel between the computing device 240 and the network 220 is available. As another indirect communication example, the light electric vehicle 210 may send information to a light electric vehicle 230. The light electric vehicle 230 may then either relay the information to a computing device 240 and/or the network 220 at a time when a communication channel between the light electric vehicle 230 and either the computing device 240 and/or the network 220 is available. If the light electric vehicle 230 relays the information to a network 220, the information may be relayed from the network 220 to the computing device 240, at a time when a communication channel between the computing device 240 and the network 220 is available.

Although FIG. 2 shows a light electric vehicle 210 and a light electric vehicle 230, it should be appreciated that information may be relayed across a plurality of other light electric vehicles in a peer-to-peer network. In an example, the information may be shared across multiple light electric vehicles until the information is received at a desired location or device (e.g., received by the network 220 and/or a computing device 240). For example, information about a first vehicle may be sent to a second vehicle, which is then sent to a third vehicle, etc., until a vehicle that has received the information is capable of communicating the information to a computing device 240 and/or the network 220. In another example where the light electric vehicle 210 sends information to a light electric vehicle 230, the light electric vehicle 230 may send the information associated with the light electric vehicle 210 in addition to information associated with the light electric vehicle 230 and/or other information received from other light electric vehicles (such that information about more than one light electric vehicle is communicated). Sharing of information about multiple light electric vehicles may shared across the peer-to-peer network.

In another example, the amount of information sent by the light electric vehicle 210. In another example, the quantity of information sent by the light electric vehicle 230 over a communication channel may be based on an amount of power provided to a communication link (e.g., communication link 174) by a processor (e.g., processor 172). Different communication links can have different power demands. For example, in order of power consumption, Bluetooth LE, Bluetooth, WiFi, LTE, 5G UWB, and 5G, may be used in different circumstances to save power based on a power tier designated by a processor. In a further example, the quantity and/or frequency of information sent via a communication channel may be based on a frequency at which power is provided to the communications link. In each of these examples, the amount and/or frequency of power provided may be associated with a power tier of the battery determined by the processor.

FIGS. 3A-3E show graphical illustrations 300A-300E of a variety of power tier managements for a rechargeable battery coupled to a light electric vehicle. Graphical illustrations 300A-300D depict graphs of time (x-axis) versus power exerted by the battery (y-axis). Graphical illustration 300E shows a timeline associated with power tier management.

Figure 3A:
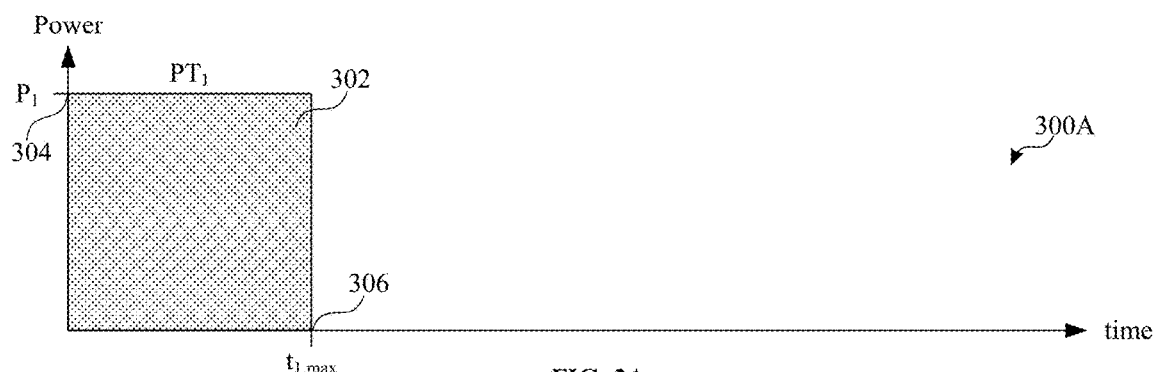
FIGS. 3A-3E illustrate a variety of power tier managements for a rechargeable battery coupled to a light electric vehicle.
Figure 3B:
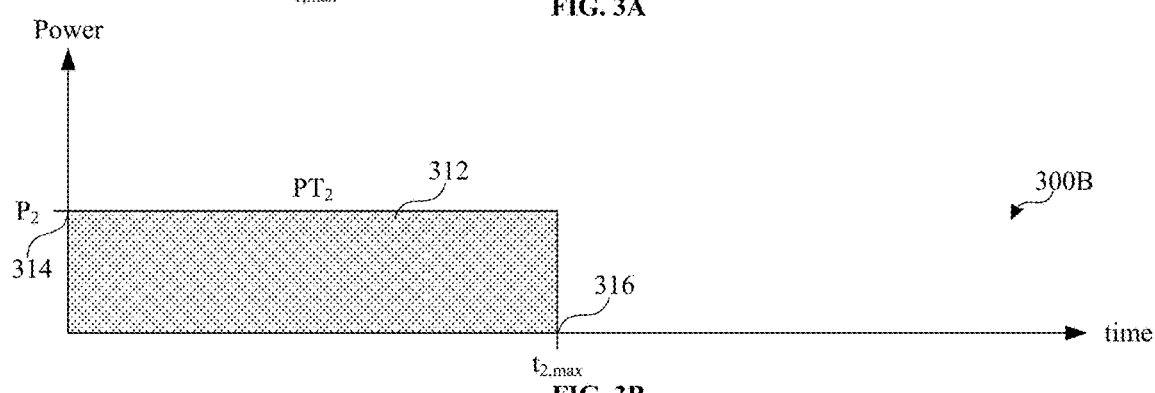
Figure 3C:
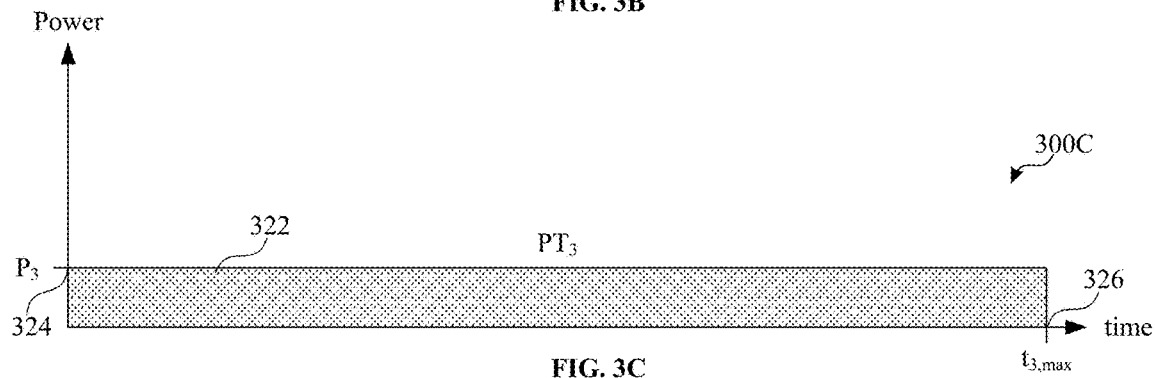

In an example, FIG. 3A shows a graphical illustration 300A of a first power tier ($PT_1$) with an associated battery energy 302 (e.g., the energy exerted by the battery, as represented by the dotted area under the curve), a first threshold power ($P_1$) 304 exerted by the battery (e.g., by the processor delivering power to different components and functionalities of the light electric vehicle), and a first power tier maximum time ($t_{1,max}$) 306 (e.g., the battery life). In another example, FIG. 3B shows a graphical illustration 300B of a second power tier ($PT_2$) with an associated battery energy 312 and second threshold power ($P_2$) 314 exerted by the battery over a second power tier maximum time ($t_{2,max}$) 316. In a further example, FIG. 3C shows a graphical illustration 300C of a third power tier ($PT_3$) with an associated battery energy 322 and a third threshold power ($P_3$) 324 exerted by the battery over a third power tier maximum time ($t_{3,max}$) 326. The first threshold power ($P_1$) 304, the second threshold power ($P_2$) 314, and the third threshold power ($P_3$) 324 may each be different. In an example, the higher the threshold power associated with a power tier, the shorter the maximum battery life. Likewise, the lower the threshold power associated with a power tier, the longer the maximum battery life (e.g., the total battery energy remains unchanged despite a change is threshold power). As shown, the first threshold power ($P_1$) 304 is higher than the second threshold power ($P_2$) 314, which is higher than the third threshold power ($P_3$) 324. Accordingly, the following relationship exists with the time associated with the threshold powers: the first power tier maximum time ($t_{1,max}$) 306 is shorter than the second power tier maximum time ($t_{2,max}$) 316, which is shorter than the third power tier maximum time ($t_{3,max}$) 326. Thus, as power or threshold power is reduced, the battery life of the battery is increased.

Thus, the power tier management run by the processor of the light electric vehicle (as described herein) may adjust the maximum battery life by adjusting a power tier and/or an associated threshold power. Power tiers and/or threshold powers may be adjusted according to preset or predetermined power tiers. For example, a power tier may be preset or predetermined based on which components and/or functionalities of the light electric vehicle are powered/enabled. In an example, the first threshold power ($P_1$) 304 may power the drive train and the fully enabled communications link of the light electric vehicle. In another example, the second threshold power ($P_2$) 314 may power the communications link (fully enabled or partially enabled) of the light electric vehicle, but not the drive train. In a further example, the third threshold power ($P_3$) 324 may power only the communications link, with limited communications channels (e.g., only allowing communication via Bluetooth through a partially enabled communications link).

Figure 3D:
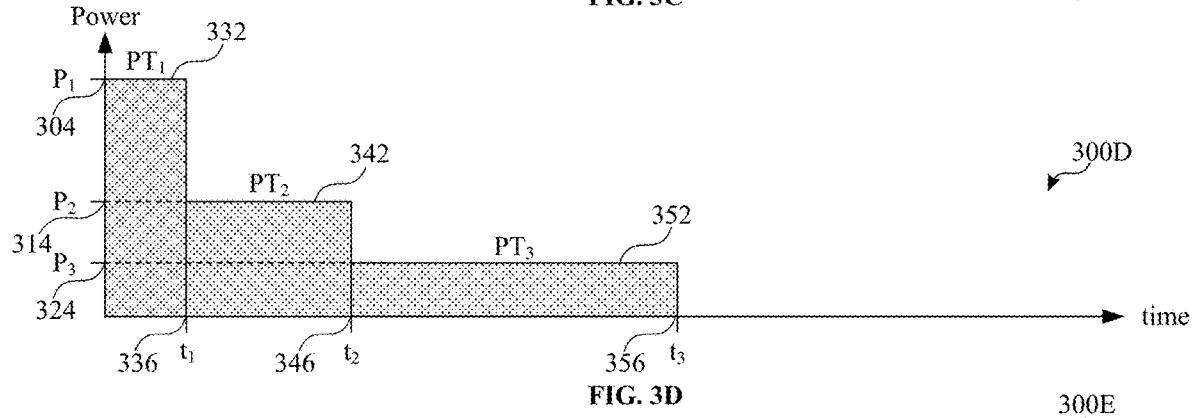

FIG. 3D shows an example of employing multiple power tiers and/or threshold powers in graphical illustration 300D. As shown, a first power tier ($PT_1$) is associated with a first threshold power ($P_1$) 304 and a first time ($t_1$) 336 to exert a first battery energy 332. After the first time ($t_1$) 336, as may be determined by the power tier management system, the processor may transition from the first power tier ($PT_1$) to a second power tier ($PT_2$). The second power tier ($PT_2$) is associated with a second threshold power ($P_2$) 314 and a second time ($t_2$) 346 to exert a second battery energy 342 from first time ($t_1$) 336 to second time ($t_2$) 346. After the second time ($t_2$) 346, as may also be determined by the power tier management system, the processor may transition from the second power tier ($PT_2$) to a third power tier ($PT_3$). The third power tier ($PT_3$) is associated with a third threshold power ($P_3$) 324 and a third time ($t_3$) 356 to exert a third battery energy 352 from second time ($t_2$) 346 to third time ($t_3$) 356. In this example, the battery's energy is depleted at the third time ($t_3$) 356 such that the battery life is the third time ($t_3$) 356.

As shown, the battery energy in each graphical illustration 300A-300C of FIGS. 3A-3C (i.e., battery energies 302, 312, 322, each being the same for a same or similar battery) is the same as the combined power tier energies in graphical illustration 300D of FIG. 3D (i.e., the combined total of first battery energy 332, second battery energy 342, and third battery energy 352). In this example, by managing and adjusting power tiers, the battery life ($t_3$) 356 is extended beyond the first power tier maximum time a ($t_{1,max}$) 306 and the second power tier maximum time ($t_{2,max}$) 316, while still allowing a first time ($t_1$) 336 at a higher, third power threshold ($P_3$) 324. Although specific power tiers and times are shown in graphical illustrations 300A-300D, it should be appreciated that any power threshold and any power tier may be selected by the processor, for any amount of time, in any order.

The processor may determine a length of time for each power tier and/or threshold power (e.g., first time ($t_1$) 336, second time ($t_2$) 346, and third time ($t_3$) 356 based on a variety of criteria and factors which may be used in combination with machine learning, as described herein. As an example, the power tier selection may be based on known location information of the light electric vehicle, such as distance from the boundaries of a geofence, distance from a specified location, distances from a cell tower, etc. Additionally, the power tier selection may be based on communication availability, such as a time since a communication channel was last available (e.g., the last time the communication link could communicate with the cloud or with a mobile device, etc.), a signal strength (e.g., service coverage) of the communication channel, etc. As another example, the power tier selection may be based on the remaining life of the rechargeable battery or a desired lifetime of the remaining battery. For example, there may be thresholds associated with power tiers and remaining life of the rechargeable battery. In this example, functionalities of the light electric vehicle may be enabled or disabled when the remaining life of the rechargeable battery crosses a threshold or enters a threshold range. As another example, power tiers may be selected based on a request for vehicle functionality. For example, a first power tier may only be available for selection if the light electric vehicle receives a request to operate the drive train. In another example, the power tier may be selected based on an unauthorized or authorized change in location of the light electric vehicle, an indication that the provider is aware of the current location, or any other indication of a status of lost or found of the light electric vehicle.

In another aspect, the functionalities associated with each power tier may be varied within each power tier to otherwise conserve remaining life of the rechargeable battery. For example, if the light electric vehicle is operating in the second power tier where functionality is limited to the communication link (all communication types), or in the third power tier where functionality is limited to the communication link (limited communication types), the frequency and content of communication may be varied. Frequency of communication may be based on a time interval, the availability of a communication channel, etc. The content of communication may vary to include more or less information about the identity information, location information, communication information, or other information about the light electric vehicle. Additionally, the vehicle may allow for receipt of information from a second light electric vehicle. If information is received from a second light electric vehicle, then the first light electric vehicle may communicate information about itself, the second vehicle, or both, based on the power tier, remaining battery life, and other factors described herein. In an example where communication is based on available communication channels, sending information via the communications link may be automatic upon determining that a communication channel is available.

Additional aspects of determining power tiers or managing battery power may be based on a determination of loss or theft of the light electric vehicle. For example, the light electric vehicle may detect a change in location without a request to operate the drive train, or in the absence of a provider's indication to move the vehicle. In the event that theft or loss is detected, the light electric vehicle may change power tiers to lengthen remaining life of the rechargeable battery and send information via the communications link. For example, upon detection of theft, the light electric vehicle may automatically select a third power tier to maximize remaining life of the rechargeable battery while also sending information via a defined communication type.

Figure 3E:
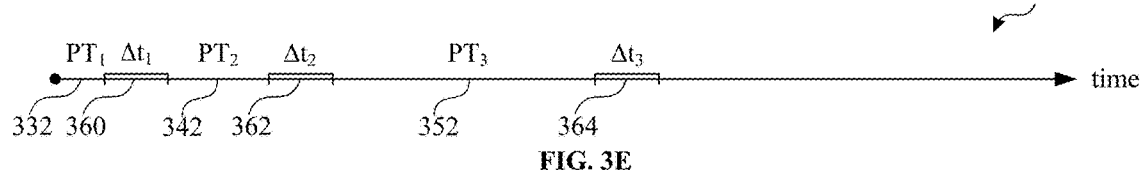

As another example, the graphical illustration 300E of FIG. 3E shows the length of time associated with a power tier may be variable, or may have a lower and upper threshold to define a variable power tier transition period (e.g., first transition period ($\Delta t_1$) 360, second transition period ($\Delta t_2$) 362, and third transition period ($\Delta t_3$) 364). For example, a first power tier ($PT_1$) 332 may range from a starting or initial time until a first time falling anywhere in the first transition period ($\Delta t_1$) 360. As another example, a second power tier ($PT_2$) 342 may range from the first time within the first transition period ($\Delta t_1$) 360 to a second time within a second transition period ($\Delta t_2$) 362. Similarly, a third power tier ($PT_3$) 352 may range from the second time within the second transition period ($\Delta t_2$) 362 to a third time within a third transition period ($\Delta t_3$) 364. The third time may be based on the battery life of the battery. For example, if the first time is closer to the upper threshold of the first transition period ($\Delta t_1$) 360 for a higher threshold power, then the battery life may be shortened such that the third time (corresponding with the battery life) is closer to a lower threshold of the third transition period ($\Delta t_3$) 364.

Figure 4:
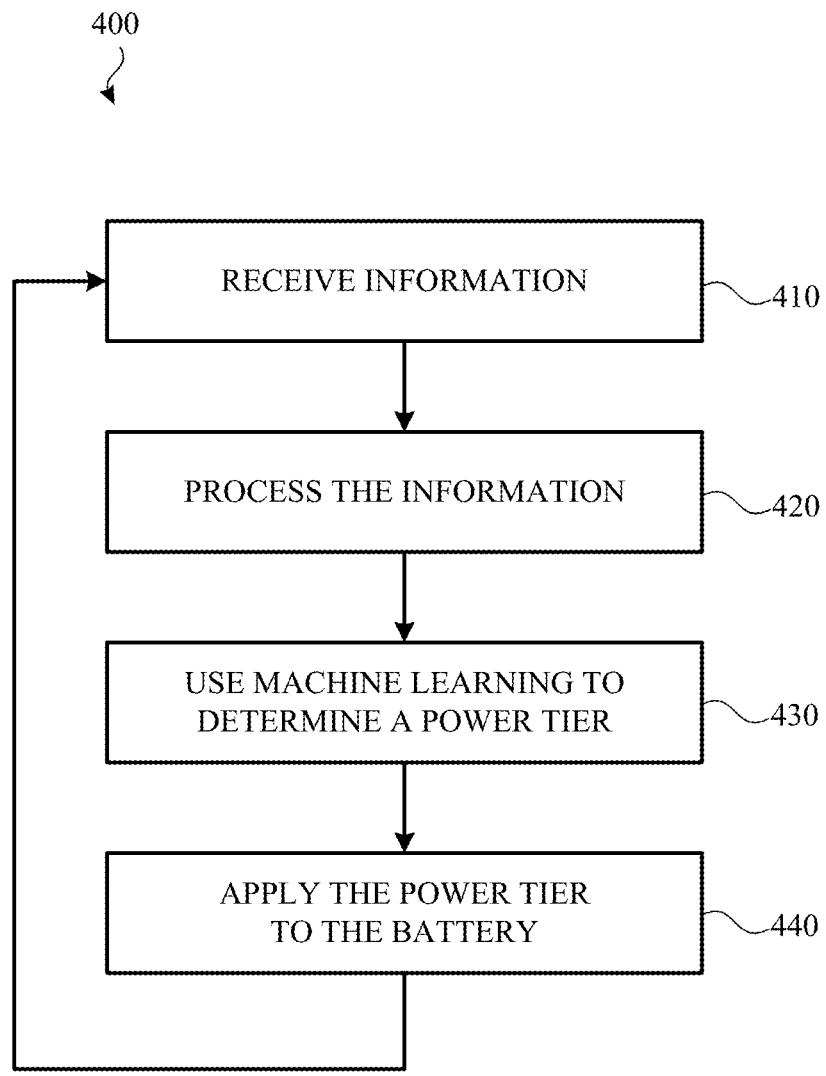
FIG. 4 illustrates a method for power tier management for a rechargeable battery coupled to a light electric vehicle.

FIG. 4 illustrates a method 400 for power tier management for a rechargeable battery coupled to a light electric vehicle. The method 400 may be used to manage or adjust power tiers of the battery 160 shown in FIGS. 1A and 1B and/or to power one or more components and/or functionalities of light electric vehicles 110, 130, 210, and 230 shown in FIGS. 1A, 1B, and 2.

Method 400 begins when the processor (e.g., processor 172) receives operating state information (410). The operating state information may be determined or received by the processor. In an example, operating state information may include a geolocation, a communication availability, and a customer identification, a remaining life of the battery (e.g., how much battery energy remains). In an example, geolocation information may include a distance from one or more of: a geofence boundary, a specified location, and a cell tower or communication tower. As another example, communication availability information may include one or more of: an elapsed time from connection with a communication channel, a communication type of the communication channel, and a signal strength of the communication channel. In a further example, customer identification information may include one or more of: a specified customer, a type or an amount of a payment transaction, or other customer account information. The system may use the customer identification to determine the power tier to correspond to the customer, such as delivering a premium or higher-power experience.

The processor may process the operating state information (420). For example, if the operating state information is associated with geolocation, the operating state information may be processed to determine whether the proximity of the light electric vehicle is within a threshold to a battery kiosk. Based on the kiosk proximity, the processor may determine a minimum power demand (e.g., delivering 12V, 18V, or 24V) for the drive train of the light electric vehicle to allow travel of the vehicle to the kiosk location. In another example, the geolocation information may be processed to determine whether the location of the light electric vehicle is within a threshold to a boundary (e.g., a boundary based on a battery kiosk, a tower location, a service location, or any other location marker). In a further example, communication availability information may be processed to determine or identify whether a signal strength is above a threshold, a time elapsed is above a threshold since a communication channel was last available, a time elapsed is above a threshold since a specific type of communication channel was last available, etc. In another example, customer information may be processed to determine whether a reliability factor of the customer (e.g., past history associated with loss or return of a light electric vehicle, if a payment was processed, etc.) is above a threshold. I another example, the time of day may be important in determining power requirements due to traffic of using accessories, such as lights. The comparison between parameters and a thresholds may be used as inputs to determining which power tier to apply. Each of these examples may be used together or in the alternative.

Other embodiments may include maintaining a database of likely destinations based on light vehicle locations or direction of travel. For example, commuters often go towards a business district in the morning and return in the opposite direction in the evening. The system may include a database of trips used to predict the most likely destinations based on light vehicle locations. The light electric vehicle can then use its current location and likely destination as another input in determining a power tier. The light electric vehicle can be in communication with one or more servers for determining likely destinations. The server may use this information to notify the light electric vehicle of the distance intended to travel. Alternatively, the user can input its destination into an application. The server can use the inputted destination to notify the light electric vehicle of the distance intended to travel. The server can notify the user if the light electric vehicle lacks sufficient battery power, or instruct the light electric vehicle to increase or decrease the power tier based on the predicted or inputted travel distance.

The processor may use machine learning to determine a power tier, or set of power tiers, based on the processed information (430). Determination of a power tier is further described herein and may include many factors and/or criteria. After the power tier is determined, the processor may apply the power tier to the battery (440). As also described herein, the processor may determine and apply an associated threshold power (e.g., first threshold power ($P_1$) 304, second threshold power ($P_2$) 314, and third threshold power ($P_3$) 324) as a maximum power to be drawn from the battery by one or more components and/or functions of the light electric vehicle. Additionally or alternatively, the processor may determine and apply a current power or determine a threshold power for a determined time (e.g., first time ($t_1$) 336, second time ($t_2$) 346, and third time ($t_3$) 356), or time transition periods (e.g., first transition period ($\Delta t_1$) 360, second transition period ($\Delta t_2$) 362, and third transition period ($\Delta t_3$ 364). As additional information is received by the processor (410), the process may repeat to adjust the power tiers applied to the battery (440).

Applying a power tier may comprise, for example, opening or closing switches, to open or close respective circuits, which restricts or allows electricity to flow to the circuits. The switches, discussed further below, may be solid state or physical switches. The system may control the switches using software stored in memory and running on the processor, as discussed throughout this application.

Figure 5:
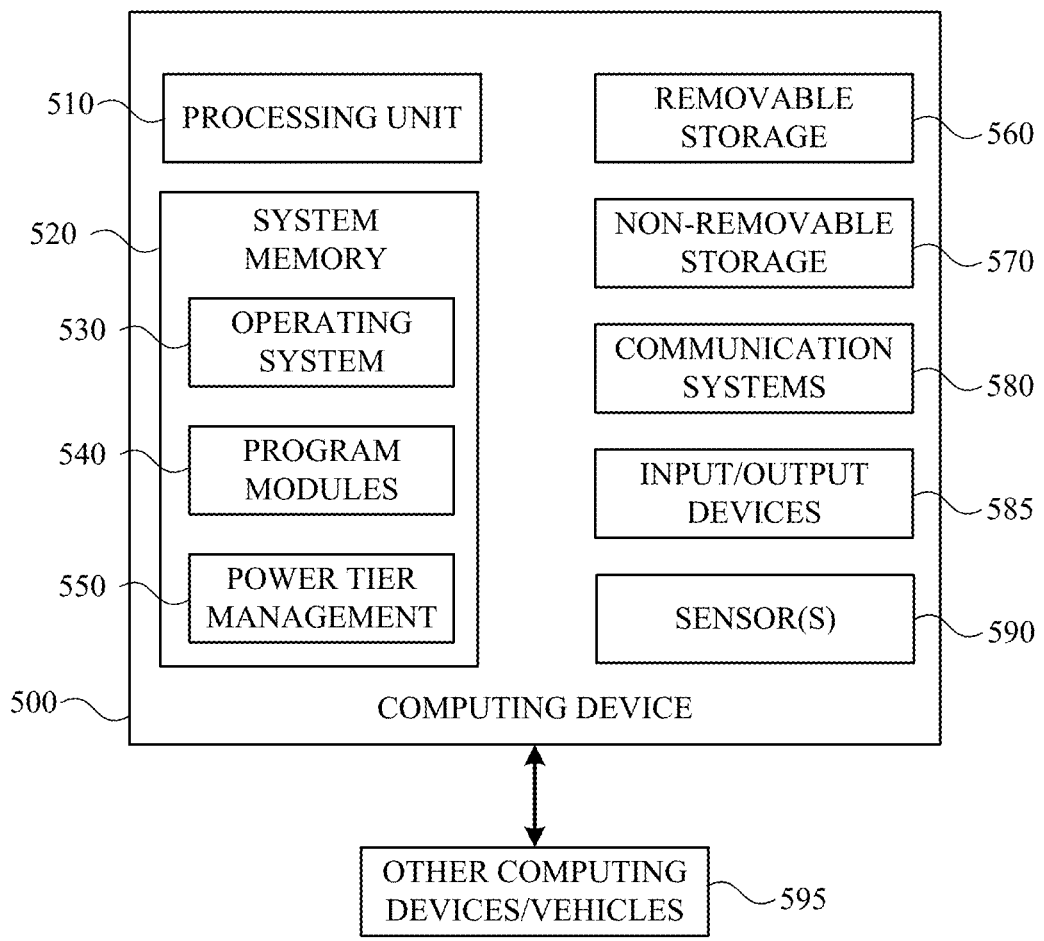
FIG. 5 illustrates a system diagram of a computing device that may be integrated or otherwise associated with power tier management of a rechargeable battery of a light electric vehicle.

FIG. 5 illustrates a system diagram of a computing device that may be integrated or otherwise associated with power tier management of a rechargeable battery of a light electric vehicle. The computing device 500 may be integrated with or associated with a light electric vehicle and/or the head unit of a light electric vehicle and/or a power tier management system described herein. As shown in FIG. 5, the physical components (e.g., hardware) of the computing are illustrated and these physical components may be used to practice the various aspects of the present disclosure.

The computing device 500 may include at least one processing unit 510 and a system memory 520. The system memory 520 may include, but is not limited to, volatile storage (e.g., random access memory), non-volatile storage (e.g., read-only memory), flash memory, or any combination of such memories. The system memory 520 may also include an operating system 530 that controls the operation of the computing device 500 and one or more program modules 540. The program modules 540 may be responsible for gathering or determining expected force readings, light electric vehicle information, and the like. The system memory 520 may also store and/or provide power tier management 550 that cause or determine power tier management of the battery of the light electric vehicle, as described herein. A number of different program modules and data files may be stored in the system memory 520, including operating state information. While executing on the processing unit 510, the program modules 540 may perform the various processes described above.

The computing device 500 may also have additional features or functionality. For example, the computing device 500 may include additional data storage devices (e.g., removable and/or non-removable storage devices) such as, for example, magnetic disks, optical disks, or tape. These additional storage devices are labeled as a removable storage 560 and a non-removable storage 570.

Furthermore, examples of the disclosure may be practiced in an electrical circuit comprising discrete electronic elements, packaged or integrated electronic chips containing logic gates, a circuit utilizing a microprocessor, or on a single chip containing electronic elements or microprocessors. For example, examples of the disclosure may be practiced via a system-on-a-chip SOC) where each or many of the components illustrated in FIG. 5 may be integrated onto a single integrated circuit. Such a SOC device may include one or more processing units, graphics units, communications units, system virtualization units and various application functionality all of which are integrated (or "burned") onto the chip substrate as a single integrated circuit.

When operating via a SOC, the functionality, described herein, may be operated via application-specific logic integrated with other components of the computing device 500 on the single integrated circuit (chip). The disclosure may also be practiced using other technologies capable of performing logical operations such as, for example, AND, OR, and NOT, including but not limited to mechanical, optical, fluidic, and quantum technologies. In addition, examples of the disclosure may be practiced using a computing device associated with or integrated with the electric vehicle and/or in any other circuits or systems.

The computing device 500 may include one or more communication systems 580 that enable the electric vehicle to communicate with rechargeable batteries, other computing devices 595, a network service and the like. Examples of communication systems 580 include, but are not limited to, wireless communications, wired communications, cellular communications, radio frequency (RF) transmitter, receiver, and/or transceiver circuitry, a Controller Area Network (CAN) bus, a universal serial bus (USB), parallel, serial ports, etc.

The computing device 500 may also have one or more input devices and/or one or more output devices shown as input/output devices 585. These input/output devices 585 may include a keyboard, buttons, switches, a sound or voice input device, haptic devices, a touch, force and/or swipe input device, a display, speakers, etc. The aforementioned devices are examples and others may be used.

The computing device 500 may also include one or more sensors 590. The sensors may be used to detect or otherwise provide information about the operating condition of the computing device 500. In other examples, the sensors 590 may provide information about a light electric vehicle and/or whether the light electric vehicle brake inspection device is operating correctly and/or is being used correctly via Diagnostics Trouble Code DTCs (e.g., sensors sending signals to the CAN-bus indicating whether the handlebar and brake lever are correctly/completely inserted into the light electric vehicle brake inspection device).

The term computer-readable media as used herein may include computer storage media. Computer storage media may include volatile and nonvolatile, removable and non-removable media implemented in any method or technology for storage of information, such as computer readable instructions, data structures, or program modules.

The system memory 520, the removable storage 560, and the non-removable storage 570 are all computer storage media examples (e.g., memory storage). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 500. Any such computer storage media may be part of the computing device 500. Computer storage media does not include a carrier wave or other propagated or modulated data signal.

Figure 6:
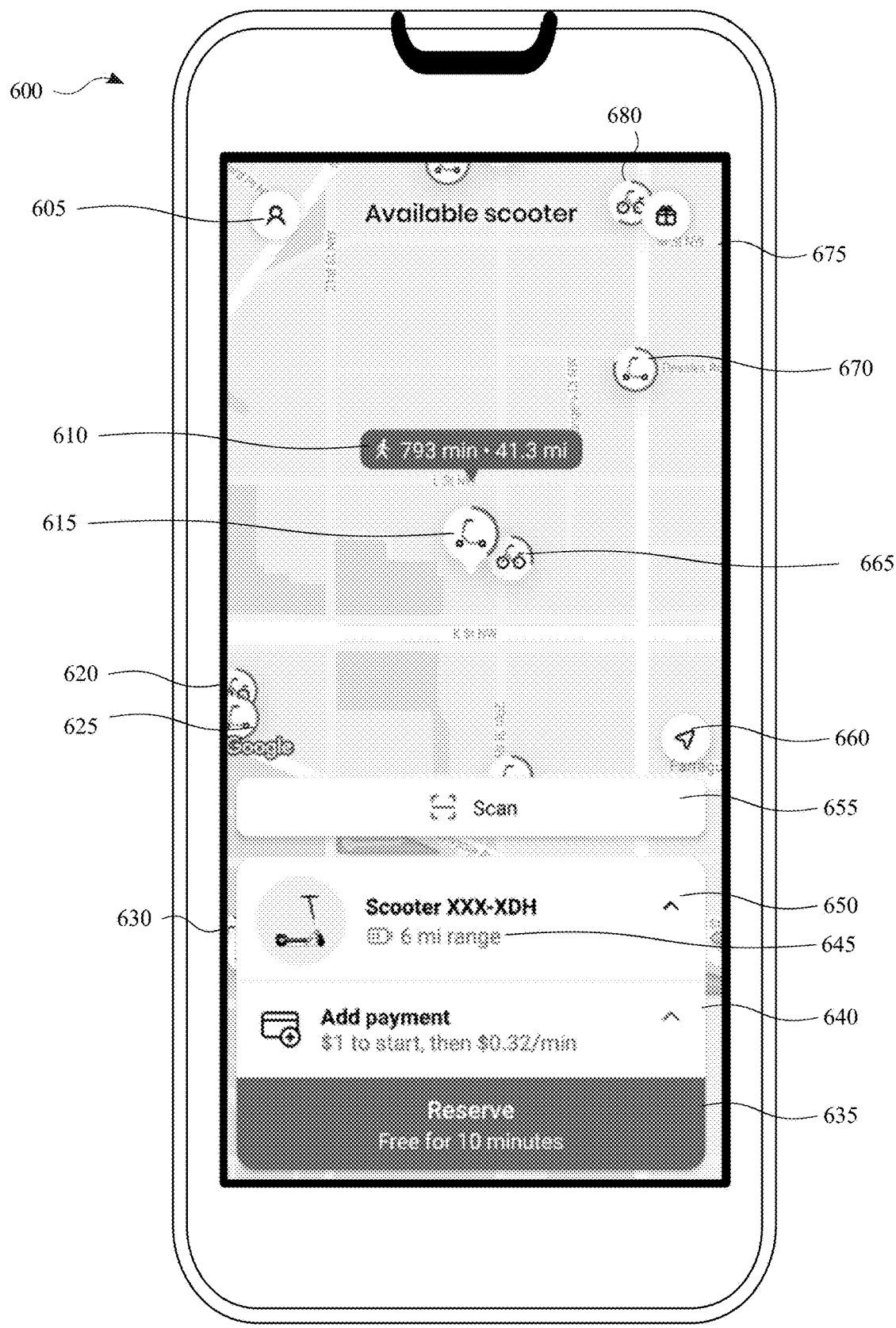
FIG. 6 illustrates an example of a graphical user interface (GUI) of an client application running on a client device.

FIG. 6 illustrates an example of a graphical user interface (GUI) 675 of an client application running on a client device 600. The GUI 675 may include many features, such as a profile or settings button 605, which when activated can provide the user's profile, such as a username, ride history, payment information, and other settings. Distance indication 610 can be displayed when a user selects a scooter icon 615, 625, 670; bike icons 620, 665, 680 can be handled similarly to the scooter icons. In this example, scooter icon 615 is in focus, and the distance indication 610 indicates that the user is 41.3 miles away from the scooter. Selecting an icon can cause the GUI 675 to display individual scooter details 630, these may include a name of the scooter or scooter model, a battery state of charge, and a corresponding range that the battery will allow the light electric vehicle to travel. Details expansion arrow 650 can allow the user to see additional details for the light electric vehicle, such as color, model, or a picture. Battery charge and range indication 645 allows the user to know how fare the light electric vehicle can travel. Reserve button 635 may allow the user to reserve the light electric vehicle. Price indication 640 may notify the user of the cost of renting the light electric vehicle. QR code scan button 655 may allow the user to scan a QR code or other unique identifier on a light electric vehicle to reserve it. Current location button 660 may allow a user to recenter the GUI 675 on the current location of the user. Each of the features may be used together or in the alternative.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Several implementations of the disclosed technology are described above in reference to the figures. The computing devices on which the described technology may be implemented can include one or more central processing units, memory, input devices (e.g., keyboards and pointing devices), output devices (e.g., display devices), storage devices (e.g., disk drives), and network devices (e.g., network interfaces). The memory and storage devices are computer-readable storage media that can store instructions that implement at least portions of the described technology. In addition, the data structures and message structures can be stored or transmitted via a data transmission medium, such as a signal on a communications link. Various communications links can be used, such as the Internet, a local area network, a wide area network, or a point-to-point dial-up connection. Thus, computer-readable media can comprise computer-readable storage media (e.g., "non-transitory" media) and computer-readable transmission media.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item, such as A and A; B, B, and C; A, A, B, C, and C; etc.

The above Detailed Description of examples of the technology is not intended to be exhaustive or to limit the technology to the precise form disclosed above. While specific examples for the technology are described above for illustrative purposes, various equivalent modifications are possible within the scope of the technology. For example, while processes or blocks are presented in a given order, alternative implementations may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed or implemented in parallel, or may be performed at different times. Further, any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

We claim:

1. A method for determining an output power tier of a rechargeable battery coupled to a light electric vehicle, comprising:
   receiving, by a processor, operating state information corresponding to the light electric vehicle;
   storing, by the processor, the operating state information in a memory;
   reading, by the processor, the operating state information from the memory to determine a predicted power demand of the light electric vehicle;
   selecting, by the processor based on the operating state information and the predicted power demand, the output power tier from a plurality of output power tiers; and
   applying, by the processor, the selected output power tier to the light electric vehicle and the rechargeable battery;
   wherein the plurality of output power tiers comprises:
      a first output power tier enabling the rechargeable battery to supply power to a drive train of the light electric vehicle and a fully enabled communications link of the light electric vehicle;
      a second output power tier enabling the rechargeable battery to supply power to the fully enabled communications link of the light electric vehicles, and to prevent the rechargeable battery from powering the drive train; and
      a third output power tier enabling the rechargeable battery to supply power to a partially enabled communications link of the light electric vehicle, and to prevent the rechargeable battery from powering the drive train and the fully enabled communications link.

2. The method of claim 1, wherein the operating state information further comprises a remaining life of the rechargeable battery.

3. The method of claim 1, wherein selecting the output power tier based on the operating state information comprises comparing the operating state information to an associated threshold.

4. The method of claim 1, wherein the operating state information comprises a distance from one or more of:
   a geofence boundary;
   a specified location;
   a customer identification; and
   a communication tower.

5. The method of claim 4, the method further comprising:
   identifying whether a communication channel is currently available; and
   transmitting an identification communication comprising location information for the light electric vehicle over the communication channel.

6. The method of claim 5, Wherein identifying whether the communication channel is currently available comprises one or more of:
   identifying an elapsed time from connection with the communication channel;
   identifying a communication type of the communication channel; and
   identifying a signal strength of the communication channel.

7. The method of claim 4, wherein the customer identification comprises one or more of:
   a type of a payment transaction;
   a specified customer; and
   an amount of the payment transaction.

8. The method of claim 1, wherein applying the selected output power tier comprises opening or closing one of more switches to deliver or not deliver power to one or more subsystems.

9. A light electric vehicle comprising:
   a plurality of switches corresponding to subsystems of the light electric vehicle that require power;
   a memory configured to store operating state information;
   a processor, operatively coupled to the memory and the plurality of switches, the processor being configured to:
      receive the operating state information corresponding to the light electric vehicle;
      store the operating state information in the memory;
      read the operating state information from the memory to determine a predicted power demand of the light electric vehicle;
      select, based on the operating state information and the predicted power demand, an output power tier from a plurality of output power tiers; and
      apply the selected output power tier to the light electric vehicle and a rechargeable battery of the light electric vehicle by opening or closing one or more of the plurality of switches;
   wherein the plurality of output power tiers comprises:
      a first output power tier enabling the rechargeable battery to supply power to a drive train of the light electric vehicle and a fully enabled communications link of the light electric vehicle; and
      a second output power tier enabling the rechargeable battery to supply power to the fully enabled communications link of the light electric vehicle, and preventing to prevent the rechargeable battery from powering the drive train; and a third output power tier enabling the rechargeable battery to supply power to a partially enabled communications link of the light electric vehicle, and preventing the rechargeable battery from powering the drive train and the fully enabled communications link.

10. The light electric vehicle of claim 9, wherein selecting the output power tier based on the operating state information comprises comparing the operating state information to an associated threshold.

11. The light electric vehicle of claim 9, wherein the operating state information comprises a distance from one or more of:
 a geofence boundary;
 a specified location;
 a customer identification; and
 a communication tower.

12. A non-transitory computer-readable medium comprising instructions to perform a method, the method comprising:
 receiving operating state information corresponding to a light electric vehicle;
 storing the operating state information in a memory;
 reading the operating state information from the memory to determine a predicted power demand of the light electric vehicle;
 selecting, based on the operating state information and the predicted power demand, an output power tier from a plurality of output power tiers; and
 applying the selected output power tier to the light electric vehicle and a rechargeable battery of the light electric vehicle;
 wherein the plurality of output power tiers comprise:
  a first output power tier enabling the rechargeable battery to supply power to a drive train of the light electric vehicle and a fully enabled communications link of the light electric vehicle; and
  a second output power tier enabling the rechargeable battery to supply power to the fully enabled communications link of the light electric vehicle, and to prevent the rechargeable battery from powering the drive train
  a third output power tier enabling the rechargeable battery to supply power to a partially enabled communications link of the light electric vehicle, and preventing to prevent the rechargeable battery from powering the drive train and the fully enabled communications link.

13. The non-transitory computer-readable medium of claim 12, wherein selecting the output power der based on the operating state information comprises comparing the operating state information to an associated threshold.

14. The non transitory computer-readable medium of claim 12, wherein the operating state information comprises a distance from one or more of:
 a geofence boundary;
 a specified location;
 a customer identification; and
 a communication tower.

* * * * *